(12) United States Patent
Jackson et al.

(10) Patent No.: US 8,329,248 B2
(45) Date of Patent: Dec. 11, 2012

(54) METHODS FOR INHIBITING TIN WHISKER GROWTH USING ABRASIVE POWDER COATINGS

(75) Inventors: Merrill M. Jackson, Tucson, AZ (US); David Humphrey, Tucson, AZ (US)

(73) Assignee: Honeywell International Inc., Morristown, NJ (US)

( * ) Notice: Subject to any disclaimer, the term of this patent is extended or adjusted under 35 U.S.C. 154(b) by 629 days.

(21) Appl. No.: 12/557,690

(22) Filed: Sep. 11, 2009

(65) Prior Publication Data

US 2010/0003398 A1   Jan. 7, 2010

Related U.S. Application Data

(62) Division of application No. 11/606,563, filed on Nov. 30, 2006, now Pat. No. 7,604,871.

(60) Provisional application No. 60/811,609, filed on Jun. 7, 2006.

(51) Int. Cl.
*B05D 5/12* (2006.01)
*B05D 7/00* (2006.01)

(52) U.S. Cl. .......... 427/96.2; 427/96.5; 427/97.1; 427/99.4; 427/180; 427/213.31

(58) Field of Classification Search ........ 427/96.2–96.6, 427/99.4, 180, 213.31, 97.1
See application file for complete search history.

(56) References Cited

U.S. PATENT DOCUMENTS

| | | | |
|---|---|---|---|
| 3,923,476 A * | 12/1975 | Roy et al. ............. | 51/295 |
| 4,888,247 A | 12/1989 | Zweben et al. | |
| 4,916,869 A | 4/1990 | Oliver | |
| 4,959,278 A | 9/1990 | Shimauchi et al. | |
| 5,384,204 A | 1/1995 | Yumoto et al. | |
| 5,472,370 A | 12/1995 | Malshe et al. | |
| 5,557,844 A | 9/1996 | Bhatt et al. | |
| 5,818,071 A | 10/1998 | Loboda et al. | |
| 5,982,623 A | 11/1999 | Matsuo et al. | |
| 6,015,597 A | 1/2000 | David | |
| 6,248,455 B1 | 6/2001 | Adams et al. | |
| 6,261,951 B1 | 7/2001 | Buchwalter et al. | |
| 6,361,823 B1 * | 3/2002 | Bokisa et al. ............. | 427/97.3 |
| 6,455,419 B1 | 9/2002 | Konecni et al. | |
| 6,472,314 B1 | 10/2002 | Catabay et al. | |
| 6,593,660 B2 | 7/2003 | Buchwalter et al. | |
| 6,734,560 B2 | 5/2004 | Catabay et al. | |
| 7,013,965 B2 | 3/2006 | Zhong et al. | |
| 7,019,399 B2 | 3/2006 | Venkatraman et al. | |
| 2003/0201188 A1 | 10/2003 | Schetty, III et al. | |
| 2005/0249969 A1 * | 11/2005 | Xu et al. ............. | 428/647 |

FOREIGN PATENT DOCUMENTS

| | | |
|---|---|---|
| EP | 1614771 A1 | 1/2006 |
| JP | 2003129278 A * | 5/2003 |
| JP | 2005108956 | 4/2005 |
| WO | 2004111312 A2 | 12/2004 |

OTHER PUBLICATIONS

PCT Search Report, PCT/US2007/085608 dated May 16, 2008.

* cited by examiner

*Primary Examiner* — Brian K Talbot

(74) *Attorney, Agent, or Firm* — Ingrassia Fisher & Lorenz, P.C.

(57) ABSTRACT

An electrical component includes a conductive substrate, a tin layer formed on the substrate, and a barrier coating formed on the tin layer to impede tin whisker growth. The barrier coating includes a polymer matrix, and abrasive particles that are dispersed about the matrix.

13 Claims, 1 Drawing Sheet

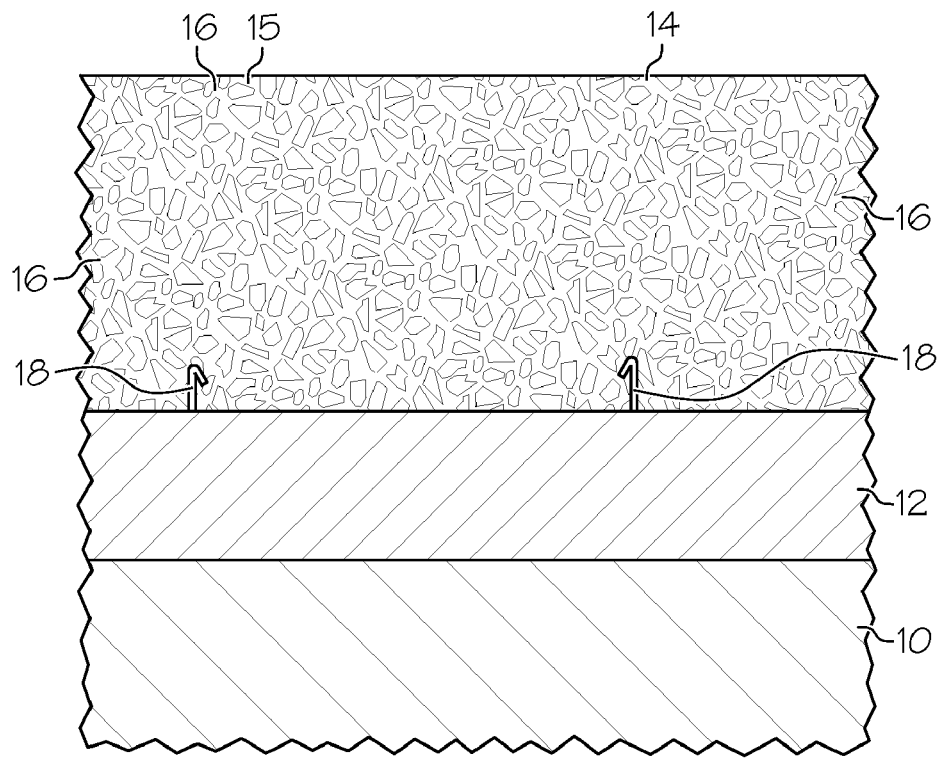
FIG. 1
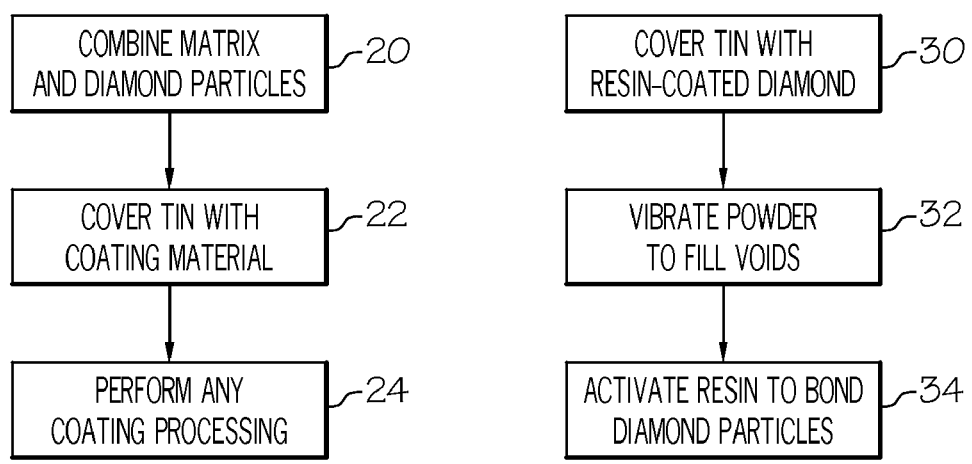
FIG. 2
FIG. 3

METHODS FOR INHIBITING TIN WHISKER GROWTH USING ABRASIVE POWDER COATINGS

CROSS-REFERENCES TO RELATED APPLICATIONS

The application is a divisional application of U.S. Non-Provisional application Ser. No. 11/606,563, filed Nov. 30, 2006, which claims the benefit of U.S. Provisional Application No. 60/811,609, filed Jun. 7, 2006. Both applications are fully incorporated herein by reference.

TECHNICAL FIELD

The present invention relates to new or refurbished electronic assemblies or assembly components that may have a metal plating or finish, and more particularly to such assemblies or components having a tin plating or finish.

BACKGROUND

Electronic assemblies or assembly components are often plated or finished with a metal. Printed wiring boards and electrical leads are just some examples of many components that typically have a metal finish. Perhaps the most abundant metal composition for a plating or a finish has been lead/tin (PbSn). However, laws and directives recently passed in several countries encourage or require the elimination of lead by those procuring, designing, building, or repairing electronic assemblies. The restriction of lead use has generated a transition by many piece part and board suppliers from PbSn surface finishes to lead-free finishes such as pure tin.

Tin finishes may be susceptible to spontaneous growth of single crystal structures known as tin whiskers. Tin whiskers are cylindrical, needle-like crystals that may grow either straight or kinked, and usually have a longitudinally striated surface. Growth rates for tin whiskers vary, although rates from 0.03 to 9 mm/yr have been reported. Interrelated factors including substrate materials, grain structure, plating chemistry, and plating thickness may influence tin whisker growth rate. Although the whisker length depends on growth rate and sustained periods of growth, in experimental tests most measure between 0.5 and 5.0 mm, although whiskers having a length of more than to 10 mm have been reported. The growth mechanisms for tin whiskers are largely unknown, although it is widely believed that whisker formation and growth are correlated with stresses such as localized compressive forces and environmental stresses on the tin plating or finish. Additional factors that may influence tin whisker growth include the materials constituting the substrate underlying the tin, and specifically a significant difference in the coefficients of thermal expansion between tin and the underlying substrate material since such a difference may stress the tin.

Tin whiskers may cause electrical failures ranging from performance degradation to short circuits. In some cases, the elongate structures have interfered with sensitive optical surfaces or the movement of micro-electromechanical systems (MEMS). Thus, tin whiskers are a potential reliability hazard. It is therefore desirable to provide materials and manufacturing procedures that mitigate the tendencies of pure tin and tin-containing solders, platings, and finishes to form tin whiskers. It is also desirable to provide such materials and methods that minimize the use of lead-containing compositions such as Pb/Sn solder.

BRIEF SUMMARY

The present invention provides an electrical component, including a conductive substrate, a tin layer formed on the substrate, and a barrier coating formed on the tin layer to impede tin whisker growth. The barrier coating includes a polymer matrix, and abrasive particles that are dispersed about the matrix.

The present invention also provides a method for impeding tin whisker growth from a tin plating or finish formed over an electrical component. The method includes the step of covering the tin plating or finish with a barrier coating comprising a polymer matrix having abrasive particles dispersed therein. The barrier coating may be formed by covering the tin plating or finish with abrasive particles, each of the abrasive particles being coated with a polymer material, and then bonding the polymer material coating the abrasive particles.

Other independent features and advantages of the preferred coatings and coating methods will become apparent from the following detailed description, taken in conjunction with the accompanying drawings which illustrate, by way of example, the principles of the invention.

BRIEF DESCRIPTION OF THE DRAWINGS

FIG. 1 is a cross-sectional view of a tin finished electrical component having a barrier coating according to a first embodiment of the present invention;

FIG. 2 is a flow diagram illustrating a first method for forming a barrier coating on a tin finished electrical component according to an embodiment of the invention; and FIG. 3 is a flow diagram illustrating a second method for forming a barrier coating on a tin finished electrical component according to an embodiment of the invention.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Electrical assemblies and components of the present invention have a tin plating or finish, and a barrier coating around the tin plating or finish. Growth of tin whiskers through the barrier coating is inhibited by including a growth disrupting material within the coating matrix material. The growth disrupting material includes abrasive powder, and is significantly harder and has a substantially different modulus properties from the coating matrix material to cause growing tin whiskers to buckle and consequently either fail to exit the barrier coating or fail to grow a substantial distance from the barrier coating outer surface.

Turning now to FIG. 1, an electrical component substrate 10 having a tin finish 12 is depicted, with a barrier coating 14 formed over the tin finish 12. Just some examples of the substrate 10 include a circuit card assembly, a wiring board, one or more components printed on a wiring board, and one or more conductive leads. The barrier coating 14 includes a relatively soft matrix material. Exemplary barrier coatings are polymers including urethane, silicone, acrylic, paralenes, and polymers having an epoxy group in the molecule thereof. As previously discussed, conventional barrier coatings that consist of the same matrix materials may be somewhat susceptible to penetration by tin whiskers 18 as illustrated in FIG. 1. For this reason, the barrier coating 14 includes a dispersion of hard abrasive powder particles 16 against which the tin whiskers 18 will buckle instead of growing through the barrier coating 14. Exemplary abrasive materials include diamond, alumina, and titanium dioxide.

The hard abrasive powder particles 16 are dispersed in a manner whereby the tin whiskers 18 have a high probability of contacting at least one particle 16 instead of growing through the barrier coating 14. For example, an exemplary coating 14 includes numerous layers of the hard abrasive powder particles 16, and preferably at least ten layers of the abrasive powder particles 16. Even a barrier coating 14 having a thickness as small as 50 microns may include at least five abrasive powder particle layers, and preferably has at least ten abrasive powder particle layers. Exemplary abrasive powder particles 16 have average diameters ranging from 0.25 to 10 microns. Depending on the overall coating thickness, larger or smaller abrasive particles 16 may be selected in order to provide a high probability for a tin whisker to collide with a abrasive particle 16 before pushing through the barrier coating 14. For example, thicker coatings may include abrasive powder particles having an average diameter of up to 50 microns. As depicted in FIG. 1, a tin whisker 18 may collide with a abrasive particle 16 close to the tin finish 12 and will consequently buckle. Other tin whiskers may grow between abrasive particles disposed closest to the tin finish 12, but will eventually collide with a more outwardly disposed abrasive particle and will consequently buckle. According to the exemplary embodiment depicted in FIG. 1, the abrasive powder particles 16 are randomly dispersed in the barrier coating 14. The particles 16 are preferably substantially homogenously dispersed, and are included at a sufficient concentration to provide a high probability for a tin whisker to collide with at least one abrasive particle 16.

According to the illustrated embodiment, the abrasive particles 16 have random and disorganized shapes. Other barrier coatings may include abrasive powder particles having selected shapes and organizations within the coating 14 to improve the likelihood for tin whiskers to collide with the particles 16.

The abrasive powder particles 16 are sufficiently hard to cause a tin whisker to buckle instead of penetrating or displacing the particle. More particularly, the particles 16 are significantly harder than the barrier coating matrix 15. Buckling occurs as a tin whisker 18 collides with a particle 16, and the coating matrix 15 provides insufficient lateral support to allow the whisker 18 to displace or grow into the abrasive particle 16. Instead, the whisker 18 bends and grows in a different direction. Whether or not the angle of contact between the whisker 18 and the particle 16 is oblique, the particle 16 has a diameter that is up to forty times that of the whisker width and consequently presents an immovable barricade. Even if the whisker 18 grazes an abrasive particle 16 and just slightly bends rather than buckling, there is still a high probability that the whisker 18 will collide with another abrasive particle instead of growing through the barrier coating 14. In addition to selecting hard abrasives as particle materials, a further significant differential between the matrix and particle hardnesses may be created by selecting a relatively soft barrier coating matrix material. For example, urethanes, silicone, and acrylics are exemplary relatively soft polymer materials that may be used as the coating matrix.

Turning now to FIG. 2, a flow diagram illustrates a general method for forming the previously-described barrier coating. Coating matrix materials are combined with abrasive powder particles as step 20 to provide a coating material. The previous description provides exemplary materials for the coating matrix, and also exemplary abrasive powder particle shapes and sizes. The materials are selected and combined in a manner that corresponds to subsequent coating or processing steps. For example, if the coating is to be sprayed, dipped, deposited, or extruded, the materials may be combined in a mixing chamber or hopper that is in communication with a deposition nozzle or an extruder.

After providing the coating material, a tin plating or finish on an electrical substrate is covered with the coating material as step 32. Just a few exemplary methods for covering the tin with the coating material include extrusion, physical or chemical vapor deposition, dipping, and spraying. The covering method is selected based on the matrix and particle materials, and the electrical components being covered.

FIG. 3 is a flow diagram that illustrates a more specific method for forming the barrier coating of the present invention. As step 30, a tin plating or finish on an electrical component is covered with polymer resin-coated abrasives. Exemplary abrasives without the resin coating have small average diameters, ranging from 0.25 to 10 microns, and consequently produce a fine dust over the tin plating or finish. For a suitable substrate surface, vibrating the abrasive powder dust is performed as step 32 to fill any previously-uncovered voids on the substrate surface with the abrasive particles. Vibrating the abrasive powder dust also thickens the dust coating in areas that previously had few abrasive particles present, and thins the dust coating in other areas. After the tin plating or finish is sufficiently covered with the coated abrasive particles, the polymer resin coating the abrasives is activated to bond the abrasive particles and the polymer as a barrier coating as step 34. Heating, humidifying, solvent addition, and radiation (i.e. UV radiation) are just some processing steps that may cure, react, or otherwise activate the barrier coating material. The activating steps may also cause any binder and/or other matrix materials that may have been included in the abrasive coating to react and conform the barrier coating to the tin plating or finish.

The several methods and coating materials therefore provide electrical assemblies and components having a tin plating or finish, and a barrier coating around the tin plating or finish. The electrically nonconductive abrasive particles dispersed in the barrier coating are growth disrupting materials that inhibit protrusion of any tin whiskers through the barrier coating. While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A method for impeding tin whisker growth from a tin plating or finish formed over an electrical component, the method comprising:

covering the tin plating or finish with a barrier coating comprising a polymer matrix having abrasive particles dispersed therein, whereby the abrasive particles dispersed in the polymer matrix impede tin whisker growth by blocking or buckling tin whiskers forming on the tin plating or finish to prevent the tin whiskers from protruding through the barrier coating.

2. The method according to claim 1, wherein the abrasive particles used during the step of covering the tin plating or finish include at least one material selected from the group consisting of diamond, alumina, and titanium dioxide.

3. The method according to claim 2, wherein the abrasive particles used during the step of covering the tin plating or finish include diamonds.

4. The method according to claim 1, wherein the polymer matrix used during the step of covering the tin plating or finish is selected from the group consisting of urethanes, silicone, acrylics, paralenes, and polymers having an epoxy group in the molecule thereof.

5. The method according to claim 1, further comprising the step of providing the electrical component having the tin plating or finish, the electrical component being at least one component selected from the group consisting of a circuit card assembly, a wiring board, a component printed on a wiring board, and a conductive lead.

6. The method according to claim 1, wherein the covering step is performed in a manner whereby at least one abrasive particle is present in substantially any cross-sectional slice of the barrier coating.

7. A method for impeding tin whisker growth from a tin plating or finish formed over an electrical component, the method comprising:
covering the tin plating or finish with abrasive particles, each of the abrasive particles being coated with a polymer material; and
bonding the polymer material coating the abrasive particles to thereby form a barrier coating comprising a polymer matrix having abrasive particles dispersed therein,
whereby the abrasive particles dispersed in the polymer matrix impede tin whisker growth by blocking or buckling tin whiskers forming on the tin plating or finish to prevent the tin whiskers from protruding through the barrier coating.

8. The method according to claim 7, further comprising the step of: vibrating the electrical component after covering the tin plating or finish with the abrasive particles to fill any voids on the tin plating or finish with the abrasive particles.

9. The method according to claim 7, wherein the abrasive particles used during the step of covering the tin plating or finish include at least one material selected from the group consisting of diamond, alumina, and titanium dioxide.

10. The method according to claim 9, wherein the abrasive particles used during the step of covering the tin plating or finish include diamonds.

11. The method according to claim 7, wherein the polymer material coating the abrasive particles during the step of covering the tin plating or finish during is selected from the group consisting of urethanes, silicone, acrylics, paralenes, and polymers having an epoxy group in the molecule thereof.

12. The method according to claim 7, further comprising the step of providing the electrical component having the tin plating or finish, the electrical component being at least one component selected from the group consisting of a circuit card assembly, a wiring board, a component printed on a wiring board, and a conductive lead.

13. The method according to claim 7, wherein the step of bonding the polymer material coating the abrasive particles produces the barrier coating in a manner wherein the coating has at least one abrasive particle is present in substantially any cross-sectional slice of the barrier coating.

* * * * *